United States Patent [19]

Dunlop et al.

[11] Patent Number: 5,298,800
[45] Date of Patent: Mar. 29, 1994

[54] DIGITALLY CONTROLLED ELEMENT SIZING

[75] Inventors: Alfred E. Dunlop, Murray Hill, N.J.; Thaddeus J. Gabara, North Whitehall Township, Lehigh County, Pa.; Scott C. Knauer, Mountainside, N.J.

[73] Assignee: AT&T Bell Laboratories, Murray Hill, N.J.

[21] Appl. No.: 970,415

[22] Filed: Nov. 2, 1992

Related U.S. Application Data

[62] Division of Ser. No. 724,560, Jun. 28, 1991, Pat. No. 5,194,765.

[51] Int. Cl.$^5$ .......................... H03K 3/01; H01S 3/30
[52] U.S. Cl. .................................. 307/270; 307/475; 307/443; 307/311; 250/551; 250/205
[58] Field of Search ............... 307/570, 270, 443, 475, 307/311; 250/205, 214 DC, 551, 552

[56] References Cited

U.S. PATENT DOCUMENTS

| | | | |
|---|---|---|---|
| 3,770,966 | 11/1973 | Sagawa et al. | 307/311 |
| 4,310,754 | 1/1982 | Check, Jr. | 250/551 |
| 4,592,057 | 5/1986 | Comerford | 250/205 |
| 4,598,198 | 7/1986 | Fayfield | 307/311 |
| 4,730,114 | 3/1988 | Portmann | 307/311 |
| 4,855,623 | 8/1989 | Flaherty | 307/270 |
| 5,095,231 | 3/1992 | Sartori et al. | 307/270 |
| 5,134,311 | 7/1992 | Biber et al. | 307/270 |
| 5,170,073 | 12/1992 | Hahn et al. | 307/270 |

OTHER PUBLICATIONS

Sensor Circuit, Patent Abstracts of Japan, Publication No. JP-59051303, publication date Mar. 24, 1984, Eguchi Osamu et al. Translation: Abstract only.
Conf. Proc. Military Microwaves '88 5-7/7/88 London (GB); P. G. A. Jones: "Digitally Controlled MMIC Attenuators-Techniques and Applications" pp. 217-222.
IEEE Journal of Solid-State Circuits, vol. 23, No. 2, Apr. 1988, "A Self-Terminating Low-Voltage Swing CMOS Output Driver", Thomas F. Knight, Jr., pp. 457-464.

*Primary Examiner*—Edward P. Westin
*Assistant Examiner*—Richard Roseen
*Attorney, Agent, or Firm*—Henry T. Brendzel; Christopher N. Malvone

[57] ABSTRACT

Effective control of impedance values in integrated circuit applications is achieved with an integrated circuit transistor whose size is digitally controlled. The digitally controlled size is achieved, for example, with a parallel interconnection of MOS transistors. In one application, the digitally controlled transistor serves as a controlled impedance connected to an output terminal of an integrated circuit. In that application, a number of transistors are enabled with control signals, and the collection of enabled transistors is responsive to the input signal that normally is applied to a conventional transistor. In another application, where the digitally controlled transistor serves as a controlled impedance at the input of a circuit, only the control signals that enable transistors and thereby determine the effective developed impedance are employed. In still another application, the digital control of the transistor's size is employed to control the speed or power consumption of the effective transistor. Such control is exercised to erase the manufacturing variability of the integrated circuit. Alternatively, such control is exercised as part of a feedback control of the operational characteristics of the entire circuit. In the feedback control application, the digital signals that control the transistor's size are obtained from an assessment of the circuit's operation. In the manufacturing variability control application, the digital signals that control the transistor's size are obtained from a measure of the integrated circuit's parameters relative to a reference element.

4 Claims, 6 Drawing Sheets

DIGITALLY CONTROLLED ELEMENT SIZING

This is a division of application Ser. No. 07/724,560 filed Jun. 28, 1991, now U.S. Pat. No. 5,194,765.

BACKGROUND OF THE INVENTION

This invention relates to integrated circuits and, more particularly, to integrated circuits where control of variability in the effective size of elements within the integrated circuits enhances the operation of such circuits.

Substantial variations can occur in the performance of integrated circuits simply because the manufacturing processes that are employed can not be carried out with the desired precision. Indeed, it is not uncommon to find substantial performance variation between integrated circuits of identical design that are manufactured on a single semiconductor wafer but at a different location on the wafer. This includes variations in delay, speed (frequency response) and power consumption.

Designers who intend to use integrated circuits must account for all possible variations in ICs' performance. Consequently, in many circumstances designers develop worst case designs, which are designs that assume all IC parameters, or characteristics, to be at their worst specified levels. Manufacturers specify the minimum and maximum values in both speed and power characteristics of their ICs. That means, of course, that the manufacturer must assure itself somehow that the integrated circuits do lie within the promised bounds of operational characteristics. In turn, that means that integrated circuits which lie outside the promised bounds have to be discarded as "defective".

Clearly, being able to narrow the variation in speed and power consumption of manufactured ICs would result in higher yield for the IC manufacturer and more desirable integrated circuits for the designer.

Whereas in bipolar ECL technology circuit means can be provided for self-control of the power dissipation within the integrated circuits, no such circuit means are available for MOS integrated circuits because of their inherently different mode of operation. The only solution for MOS circuits is, as indicated above, to select the integrated circuits that match the specifications, after those circuits have been manufactured.

An issue that is related to speed and power dissipation of elements throughout the integrated circuit is the issue of creating specific impedances that are presented at input/output terminals of the integrated circuits. This issue encompasses both digital and analog signals (i.e., both digital and analog ICs) and encompasses terminals that transmit signals as well as terminals that receive signals.

When signals exit an IC terminal, flow along a signal path over an appreciable distance and enter another IC terminal, signal reflections can be experienced from impedance discontinuities along at any point along the signal path, and specifically from the terminals. Most reflections can cause considerable problems in both digital and analog environments (e.g., mis-detection of digital signals). It is well known, however, that when the signal path is viewed as a transmission line with a characteristic impedance, undesirable reflections are eliminated when the transmission line is terminated at the sending and/or receiving ends with impedances having a value equal to the characteristic impedance of the transmission line. In other words, what is needed for effective transmission of very high frequency signals through signal paths of appreciable length is integrated circuits where both input and/or output terminals have specified and well controlled impedances.

The most general requirement for such termination impedances is that the impedance be the same for both positive and negative signals. A somewhat weakened version of this requirement is permitted when the circuit either delivers or expects to receive signals of a single polarity. One example of this situation is found when the integrated circuit delivers power in digital form (either delivers some power, or delivers no power). The same applies when the circuit absorbs power. Only when power is delivered must be output impedance be equal to the transmission line characteristic impedance. Also, even in the absence of a transmission line, it is well known that for optimum power transfer the output impedance of a signal source must equal the load impedance.

In an article titled "A Self-Terminating Low-Voltage Swing CMOS Output Driver", IEEE Journal of Solid-State Circuits, Vol. 23, No. 2, pp. 457–464, April 1988, Knight et al. described one CMOS circuit arrangement for developing a digital signal at an output terminal that is characterized by a specified and controlled output impedance. The output buffer of their arrangement consists of a series connection of a P-channel transistor having its drain connected to the drain of an N-channel transistor, while the sources of the two transistors are connected to their respective power supplies. The junction point where the drains of the two transistors are connected is also connected to the output terminal. The gate of each of the transistors is driven by a separate pre-drive circuit, and the pre-drive circuits enable and control their respective transistors in an alternating fashion. More specifically, each pre-drive circuit sets the gate-to-source voltage of its respective transistor to a specified level to insure that the transistor presents a predetermined impedance to the terminal.

Each of the pre-drive circuits is a digital inverter connected between a fixed voltage source and a variable voltage source. Each pre-drive circuit is also responsive to a digital input signal. The digital signal of one pre-drive circuit is the logical inverse of the digital signal of the other pre-drive circuit.

The Knight et al. arrangement suffers primarily from a number of deficiencies. Each of the pre-drive circuits requires a controllable analog voltage, and since the levels for this voltage must be maintained under changing operating conditions, the circuitry for creating this voltage is difficult to design, comprises a substantial number of components and consumes a considerable amount of power. Noise is also a problem.

SUMMARY OF THE INVENTION

Effective control of impedance values in integrated circuit applications is achieved with an integrated circuit transistor whose size is digitally controlled. The digitally controlled size is achieved, for example, with a parallel interconnection of MOS transistors. In one application, the digitally controlled transistor serves as a controlled impedance connected to an output terminal of an integrated circuit. In that application, a number of transistors are enabled with control signals, and the collection of enabled transistors is responsive to the input signal that normally is applied to a conventional transistor. In another application, where the digitally controlled transistor serves as a controlled impedance at the input of a circuit, only the control signals that enable transistors and thereby determine the effective developed impedance are employed. In still another application, the digital control of the transistor's size is employed to control the speed or power consumption of the effective transistor. Such control is exercised to erase the manufacturing variability of the integrated circuit. Alternatively, such control is exercised as part of a feedback control of the operational characteristics of the entire circuit. In the feedback control application, the digital signals that control the transistor's size are obtained from an assessment of the circuit's operation. In the manufacturing variability control application, the digital signals that control the transistor's size are obtained from a measure of the integrated circuit's parameters relative to a reference element.

DETAILED DESCRIPTION

The principles of this invention, as disclosed in greater detail below, are advantageously applicable to the two applications described above. That is, the disclosed principles are applicable to the task of reducing the manufacture-related variations in transistor size between integrated circuits of a given design. And, they are eminently applicable to the task of controlling the impedance presented at input/output terminals of integrated circuits. The terminal impedance issue is addressed first. Thereafter, the general sizing control application is described.

Figure 1:
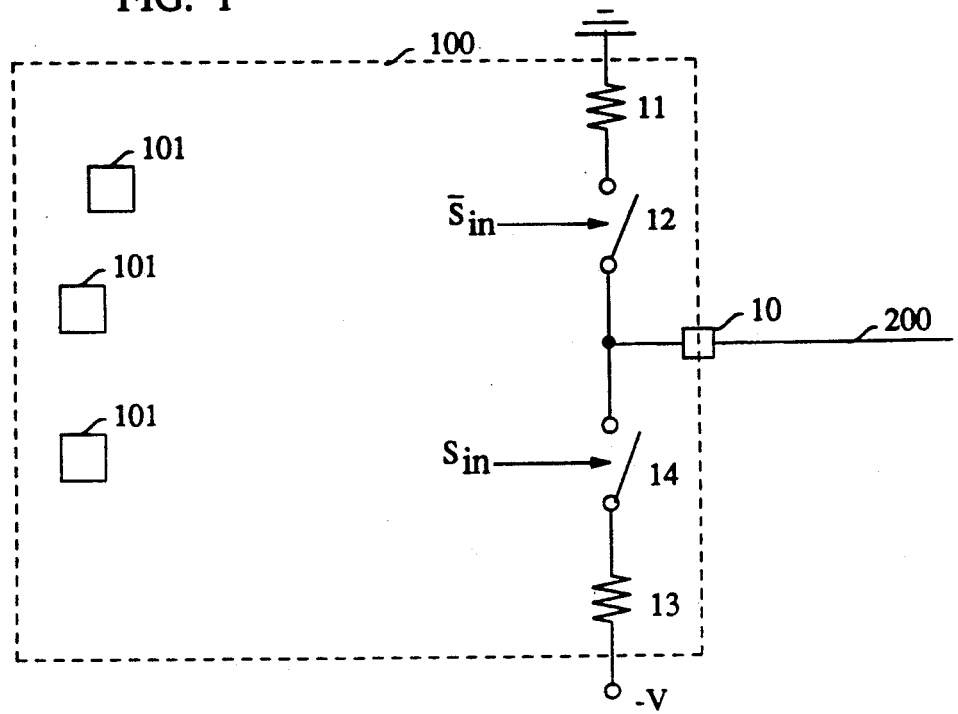
FIG. 1 presents an idealized view of an output drive circuit.

FIG. 1 presents an idealized view of an output terminal 10 that delivers a digital signal to a transmission line 200. Block 100 represents the functional circuitry that is associated with output terminal 10, and that functional circuitry may have other terminals (input and/or output) with which it is associated. For purposes of this disclosure, the exact nature of circuitry 100 is irrelevant and, for sake of simplicity, the relationship of circuitry 100 with other terminals is not treated.

The output drive stage of circuitry 100 that is associated with terminal 10 is idealized with impedances 11 and 13. Impedance 11 has one lead connected to ground potential and the other lead connected to one lead of controllable switch 12. The other lead of switch 12 is connected to terminal 10. Similarly, a resistor 13 is connected to a fixed negative potential and to controllable switch 14. Like switch 12, switch 14 has one lead connected to terminal 10.

Switch 14 is controlled by a digital input signal $S_{in}$ and switch 12 is controlled by its logic inverse, $\bar{S}_{in}$. When switch 14 is closed and switch 12 is open, current flows from transmission line 200 to the fixed negative potential, and the impedance that this current encounters is impedance 13. When switch 14 is open and switch 12 is closed, current flows from the ground potential into transmission line 200, and the impedance encountered by this current is impedance 11. Ideally, impedances 11 and 13 are equal to each other and set to correspond to the characteristic impedance of the transmission line; e.g., 50 ohms.

In connection with the need to make elements 11 and 13 equal to each other and also set them to a predetermined value the following should be noted. First, the most prevalent realization of an impedance within an MOS integrated circuit is an MOS transistor that is turned on. The degree to which the transistor is turned on provides one avenue of control over the value of the generated impedance, and the size of the transistor provides another avenue of control over the value of the generated impedance. Although the principles of this invention apply to other realizations of impedances, this disclosure deals only with this most-prevalent approach. Second, with the design techniques available today, it is possible to create integrated circuit MOS transistors which have very similar characteristics in the same environment. Hence, it is not too difficult to create impedances 11 and 13 that have essentially the same value, or that are related to each other by a predesigned fixed ratio. However, it is extremely difficult to (consistently) manufacture impedances 11 and 13 with a specific value.

Recognizing this great difficulty, in accordance with the principles of this invention, the values of impedances 11 and 13 are controlled digitally during the circuit's operation.

Figure 2:
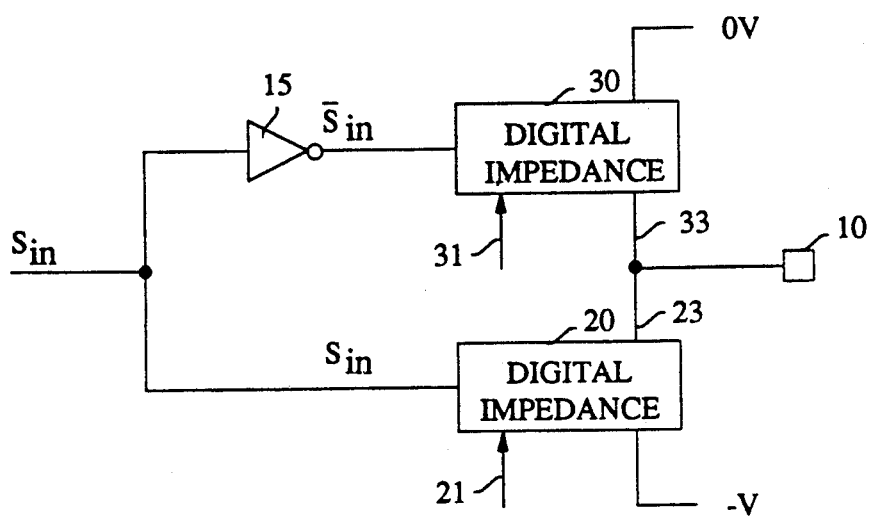
FIG. 2 presents a diagrammatic view of the FIG. 1 arrangement, accentuating the signal interfaces to the output drive elements.

FIG. 2 presents a diagrammatic view of the FIG. 1 arrangement. It includes a digital impedance block 20 responsive to input signal $S_{in}$ and to the negative voltage source. It also includes a digital impedance block 30 that is responsive to the inverse of $S_{in}$ (derived via inverter 15) and to the ground potential. The outputs of blocks 20 and 30 (23 and 33) are interconnected and applied to output terminal 10. To provide for the aforementioned digital control, block 20 is responsive to digital control signal bus 21 and block 30 is responsive to digital control signal bus 31.

Figure 3:
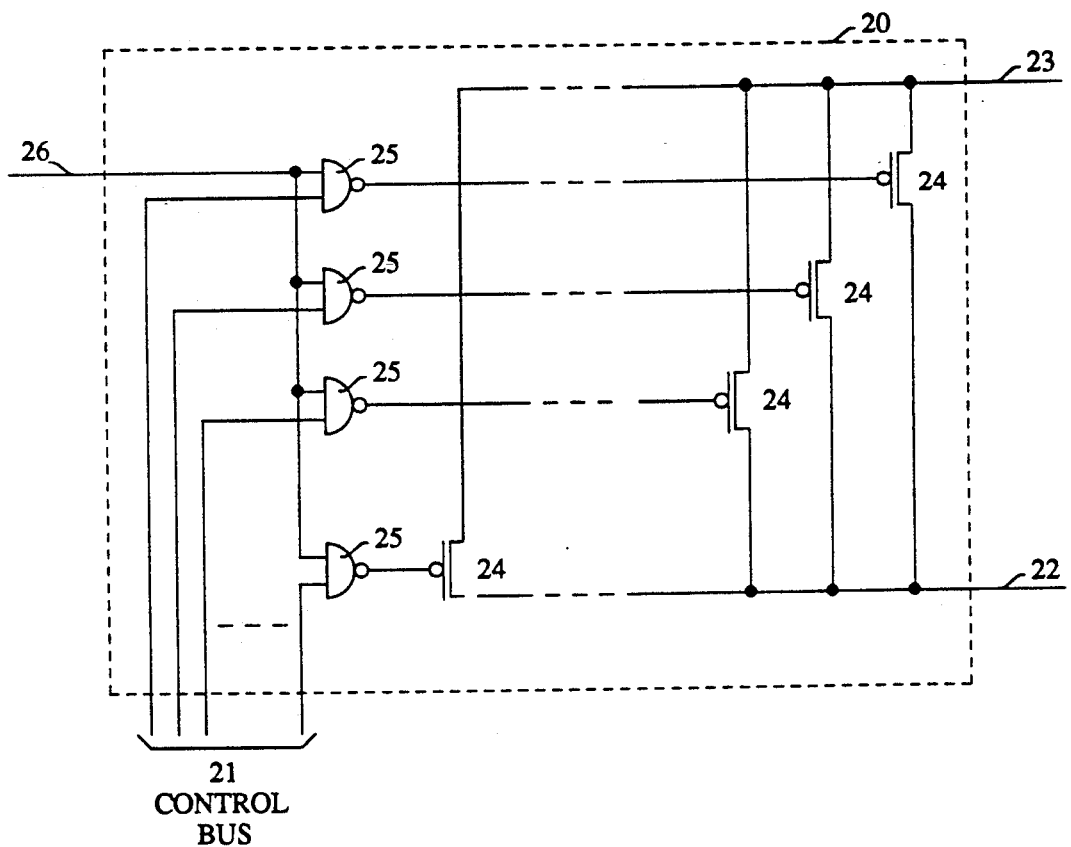
FIG. 3 presents a schematic diagram of one embodiment for digital impedance block 20 of FIG. 2.

FIG. 3 presents one embodiment for digital impedance block 20 (block 30 is of essentially identical construction). It is basically a digitally-sized transistor. The kernel of FIG. 3 comprises a parallel interconnection of MOS transistors 24 between the block's fixed negative potential terminal 22 and the block's output terminal 23. In the "impedance control" application, this arrangement basically represents a parallel connection of resistive paths. The number of transistors 24 used is a design choice. Each of transistors 24 is controlled (at its gate terminal) with a NAND gate 25. Gates 25 are two input gates. One input of gates 25 is connected to input terminal 26 of the digitally sized block which, in this case, is a digital impedance block. The remaining inputs of gates 25 are combined to form the digital control bus (21) of the digital impedance block.

The basic idea behind the FIG. 3 structure of digital impedance circuit 20 is that a number of transistors 24 are fully turned on by the control signals and thereby placed in their low impedance state. By placing a sufficient number of such transistors in their low impedance state, the effective impedance between terminals 22 and 23 can be lowered to the desired level. It is simply an addition of conductances.

As an aside, although FIG. 3 is depicted with a parallel interconnection of resistors, the principles of this invention can be applied with equal effectiveness, where the applications calls for, to other interconnection arrangements, such as a series connection of elements, or a series and parallel connection of elements. Also, a skilled artisan should realize that transistors 24 may be N-channel rather than P-channel as depicted in FIG. 3, and gates 25 would then be AND gates rather than NAND gates. In some applications, a different logic function in gates 25 may prove useful, such an OR, NOR or EXOR.

In the FIG. 3 arrangement, transistors 24 can be sized identically. In that case, each transistor that is enabled by control bus 21 increases the conductance between terminal 22 and 23 by a fixed increment. This provides a linear stepwise adjustment function in the conductance between terminal 22 and 23.

Another approach to sizing of transistors 24 is to make the impedances of transistors 24 related to each other by a power of 2. That is, the first and smallest transistor may have a conductance X, the second transistor (of the same length) is twice as wide and has the conductance 2X, and the $n^{th}$ transistor is $2^n$ times as wide and has the conductance $2^n X$.

This binary approach requires a fewer numbers of parallel paths than the approach employing equally sized transistors (log K transistors for the binary approach vs. K transistor for the uniform approach). However, a timing problem is sometimes encountered when a given transistor is enabled and, concurrently, all the previously enabled transistors must be disabled (e.g., switch from 01111111 to 10000000).

Still another approach to sizing of transistors 24 groups transistors 24 into two or more subsets. When two subsets are used, the transistors in one subset are used to coarsely adjust the overall impedance, while the transistors in the other subset are then used to finely adjust the overall impedance. Of course, more than two subsets can be used to produce an "in between" coarseness adjustment capability. In one coarse/fine control embodiment, for example, the total width of the transistors in the "fine" subset was made to equal the width of a single transistor in the "coarse" subset, and there were 16 transistors in each of the subsets.

Figure 4:
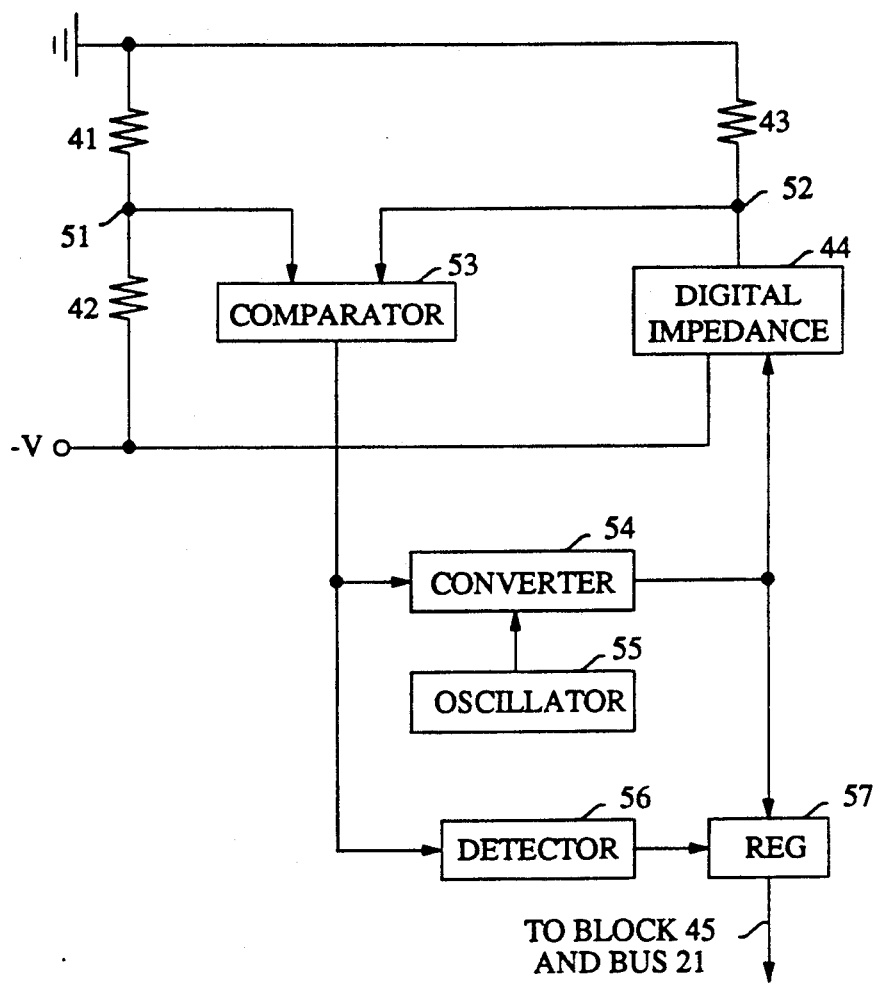
FIG. 4 illustrates the circuitry for controlling digital impedance 20.

FIG. 4 illustrates the circuitry for developing the impedance control signals. More specifically, it illustrates the circuitry for developing the impedance control signals for digital impedance block 20 of FIG. 2. The circuit of FIG. 4 is basically a Wheatstone bridge. It includes an impedance 41 connected between the ground potential terminal and balance terminal 51, an impedance 42 connected between the negative potential terminal and balance terminal 51, a reference impedance 43 connected between the ground potential terminal and balance terminal 52, and a digital impedance block 44 connected between the negative potential terminal and balance terminal 52. Impedances 41 and 42 are of any convenient value but of a given ratio. Impedance 44 is the impedance that is controlled in the course of balancing the bridge, and impedance 43 is the reference impedance. Since only the ratio of impedances 41 and 42 is important for balancing the bridge, those impedances can be impedances that are created on the integrated circuit. Impedance 44 is a controlled impedance and being on the integrated circuit it, if effect, tests the manufacturing quality of the integrated circuit. Impedance 43 is the only impedance that must be accurately formed. Of course, impedances 41 and 42 do not have to be created on the integrated circuit, and when they are created on the integrated circuit, care must be exercised to make the of a known ratio and track each other. A possible arrangement that satisfies this criterion is resistances made within a highly doped poly-silicon layer formed on the integrated circuit substrate.

In operation, when the ratio of impedance 44 to impedance 43 is not equal to the ratio of impedance 42 to impedance 41, a voltage difference appears between balance terminals 51 and 52. This voltage difference is measured by comparator 53. The objective in balancing the bridge is to make this voltage approach zero. This objective is realized in a clocked fashion by applying to converter 54 a clock and the output of comparator 53. The clock is derived from oscillator 55.

Converter 54 develops a set of digital signals that are applied to the impedance control bus of digital impedance block 44. When the parallel arrangement of the resistive paths in block 44 comprises transistors of equal size, converter 54 may be implemented simply with a bi-directional shift register having the left-shift input supplying a logic level 1, and the right-shift input supplying a logic level 0. The output of comparator 53 determines whether the shift register shifts to the right or to the left. When the comparator output indicates that the voltage at terminal 52 is lower than the voltage at terminal 51, the need is to shift more 0's into the shift register.

When the parallel arrangement of the resistive paths in block 44 comprises transistors that are related to each other in the binary manner described above, converter 54 may be implemented with an up/down counter that is advanced by the clock, where the up/down control of the counter is responsive to comparator 53. When the comparator output indicates that the voltage at terminal 52 is lower than the voltage at terminal 51, the need is to reduce the count in the counter and, therefore, the up/down control is set for "count-down".

When the parallel arrangement of resistive paths in block 44 comprises subsets of transistors in accordance with the coarse/fine control schema described above, converter 54 is only slightly more complex. It can be implemented, for example, with a binary up/down counter as described above, followed by a number of sub-converters that are responsive to the up/down counter. The sub-converters convert a binary number to an equivalent number of 1's. In the implementation described above where there are two subsets and where the subset of the small transistors includes 16 transistors with a combined width equal to the width of a single transistor in the subset of large transistors, a first sub-converter is connected to the four least significant bits of the up/down counter and a second sub-converter is connected to the higher order bits of the up/down counter.

As suggested above, the bridge of FIG. 4 operates on impedance 44 but impedance 44 merely evaluates the characteristics of the integrated circuit. More particularly, impedance 44 evaluates the variability in the integrated circuit characteristics from some nominal value. This evaluation is reflected in the control signals that are developed by converter 54. If block 20 is constructed in a manner that is compatible with the construction of impedance block 44 then, consequently, the developed control signals that are applied to digital impedance block 44 can be applied to block 20 directly. For example, when the parallel resistive paths within block 44 are of equal impedance, and the parallel resistive paths within block 20 are also of equal impedance, then the digital control signals developed by converter 54 can be applied directly to bus 21. The resistances of the resistive paths in block 20 need not be the same as the resistances of the resistive paths in block 44; but when they are not, the effective impedance presented by block 20 is different from the effective impedance presented by block 44 (but a fixed ratio between their values is maintained). Actually, a different resistors schema can exist in block 20 than in block 44 (e.g. binary values in one, and equal values in the other) but, if that is the case, the control signals of impedance block 20 must be appropriately translated to correspond to that different schema. Such translation may be accomplished with a separate translator (not shown) that is interposed between converter 54 and bus 21. The subconverters described above are such translators.

When the differential voltage applied to comparator 53 reaches a minimum, the operation of the FIG. 4 circuit tends to result in oscillations, with the output of comparator 53 regularly alternating between logic level 1 and logic level 0. Although such oscillations are not a real problem, it makes sense to block the oscillations from the control to block 20. The advantage in such isolation lies in the fact that the signal lines that communicate the digital information to block 20 do not have to be continually raised to one level only to be lowered to another level at the subsequent clock period. This conserves power and prevents injection of unnecessary noise that is induced by the switching. In FIG. 4 this isolation is carried out with detector block 56 and register 57. Block 56 is connected to comparator 53. It is set to detect the presence of a sequence of alternating 1's and 0's (i.e., a chosen number of 1,0 pairs) in the logic output of comparator 53. When the sequence it detected, it develops a disablement signal and applies it to register 57. Register 57 is connected to the output of converter 54 so that each change in the output of converter 54 is reflected in the output of register 57 until the disablement signal freezes the output of register 57. The output of register 57 remains frozen as long as comparator 53 continues to output a sequence of alternating 1's and 0's.

In FIG. 4, the output of register 57 is a set of digital signals that are applied to bus 21 of FIG. 3. Actually, since it is expected that register 57 will alter its state rather seldomly, the expected data rate between the bridge of FIG. 4 and the NAND gates of FIG. 3 is very low. If signal lines are very expensive to create (e.g. occupy too large a portion of the substrate), the information from the bridge of FIG. 4 to the NAND gates of FIG. 3 can be sent serially. This can be done by sending the shift-right/shift-left signals of converter 54 (which are enabled by detector 56) directly to the FIG. 3 circuit, where a converter that is similar to converter 54 is included.

It is quite likely that the control signals applied to digital impedance block 20 are different from the control signals that need to be applied to digital impedance block 30. This is because the transistors in block 20 have a back-gate bias effect which the transistors in block 30 do not.

Figure 5:
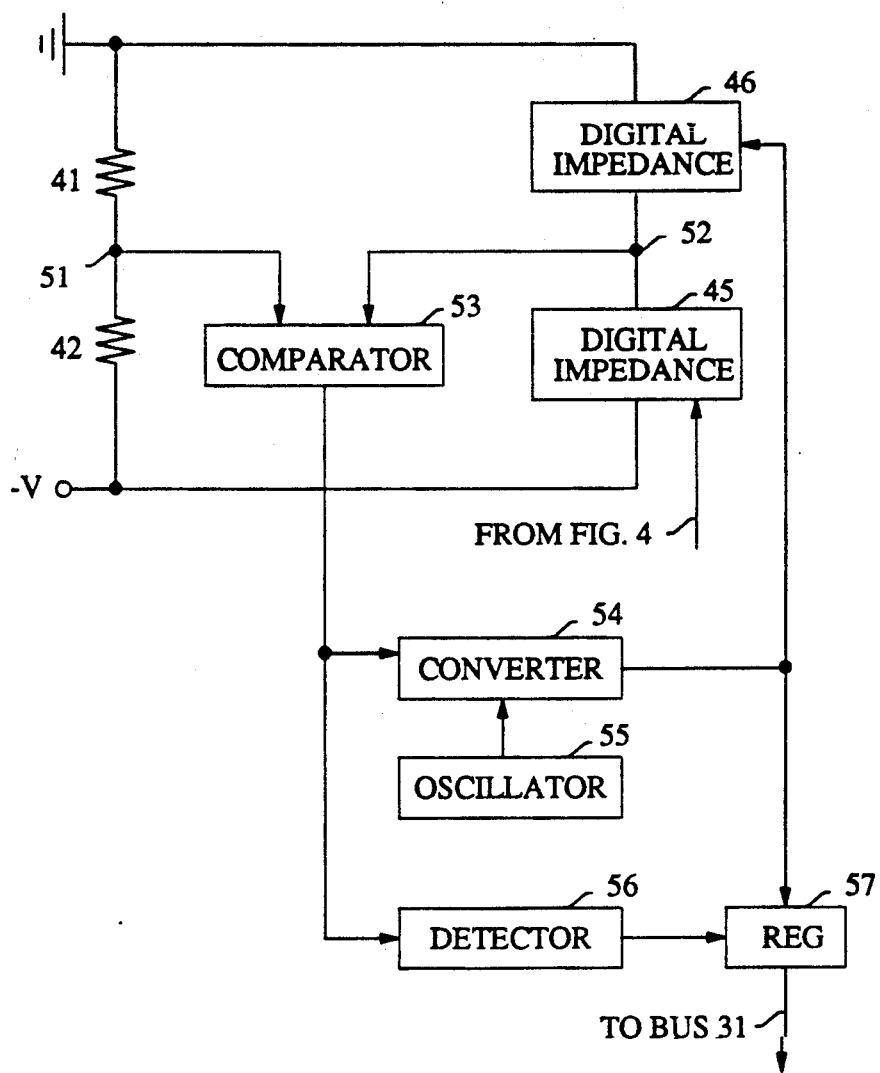
FIG. 5 depicts circuitry for controlling digital impedance 30 of FIG. 2.

FIG. 5 presents the circuit for creating the control signals for block 30. It is essentially identical to FIG. 4, except that in FIG. 4, a fixed "reference" impedance 43 is employed, while in FIG. 5 a digital impedance block 45 is used. Block 45 is identical to block 44 of FIG. 4 and is controlled by the signals controlling block 44 (after register 57). In FIG. 5, the impedance that is controlled and thus modified is digital impedance 46.

As suggested above, the accuracy of the impedances derived with the digital control signals developed in the FIG. 4 and FIG. 5 circuits is related to a) the accuracy of the ratio of impedances 41 and 42 and b) the accuracy of the absolute value of impedance 43. Since the only element that must be accurate in the absolute sense is impedance 43, it means that all of the other elements contained in FIGS. 1-5 can be created within an integrated circuit substrate, together with functional circuitry 100. As for impedance 43, until a technique is developed for creating an accurate impedance on a substrate, impedance 43 must be realized with an "off the chip" component. Of course, it is known that under certain circumstances accurate resistors can be created in silicon with the use of laser trimming, laser/electrical blowing of links, etc.

Figure 6:
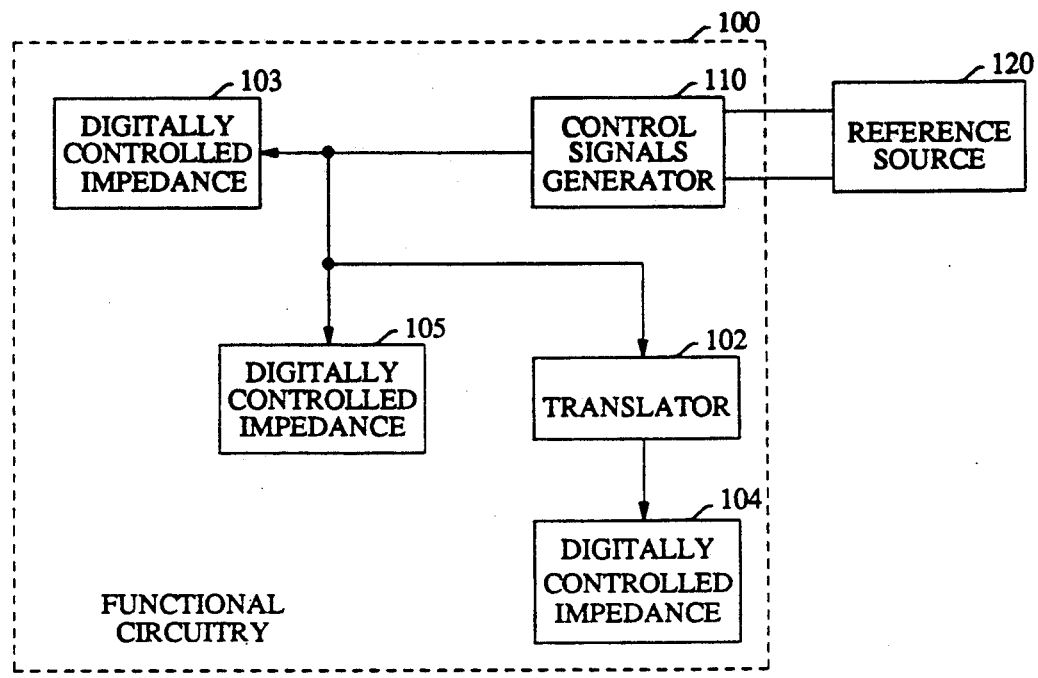
FIG. 6 presents an application where different sets of circuit elements are controlled with related digital control signals.
Figure 7:
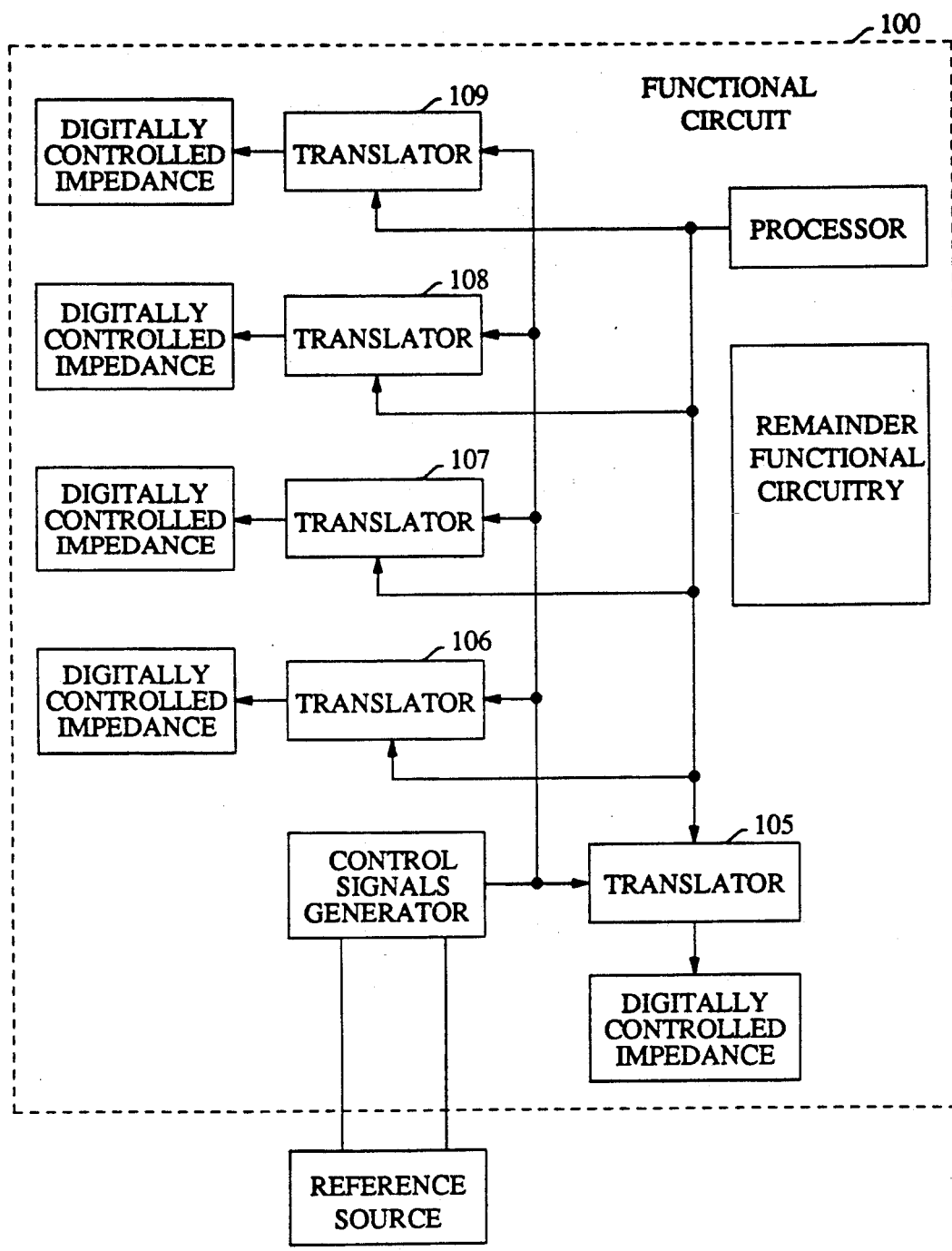
FIG. 7 illustrates an application where the different control of different circuit elements is under processor control.

It should be noted that there is a need for only one reference impedance 43 for as large a circuit (functional circuitry 100) as is reasonably expected to maintain the same, or tracking, characteristics. In the case where the same impedances are needed and those impedances are subjected to the same variations to which impedance 20 is subjected, the control signals applied to block 20 can be applied to all impedances that are connected between an output terminal and the negative fixed potential, and the control signals applied to block 30 can be applied to all impedances that are connected between an output terminal and the ground potential. In the case where there is a fixed relationship between the block 20 impedance and some other impedances, a translation circuit can be interposed between the control circuits of block 20 and the control terminal of those different impedances. This is illustrated in FIG. 6 where the digital control signals generator 110 sends digital signals to controlled impedances 103 and 105 of functional circuitry 100, and translation circuit 102 translates those signals and sends them to other controlled impedances (e.g. 104) of functional circuitry 100. Note that reference source 120 is outside circuitry 100. Translation circuit 102 can actually be modifiable, for example under program control, and that is depicted in FIG. 7 with translators 105-109.

The FIG. 3 diagram depicting digital impedance block 20 creates an impedance that is also controlled by an input signal (terminal 26). The control at terminal 26 basically enables the impedance when the appropriate input signal is applied, and completely disables the impedance otherwise. This effectuates the switch action of FIG. 1 and serves the function of the digital signal control of element 20. Element 20, thus, is not merely an impedance, but a controlled impedance signal transmitting element. When a terminal is used to receive information, no such switch action is necessary or desired in the impedance presented at the terminal. Rather, what is needed is a fixed input impedance of a given value. This can easily be achieved by simply replacing NAND gates 25 in FIG. 3 with inverters that are responsive to the control signals of bus 21. Or, for certain applications where the digital impedance serves the function of an input terminating impedance, it nevertheless can be disabled by the signal at terminal 26.

In some cases it is known that the signal applied to an input terminal is uni-directional, in the sense that current always flows in one direction through the terminal (e.g., into the terminal). The current may alternate between a large value and a small value, but it may still be uni-directional. Such a condition exists, for example, when the source that delivers such a signal is an emitter coupled logic (ECL) device. In such a circumstance, there is no need to provide two digital impedances as depicted in FIG. 2. One is sufficient.

There are also some applications where power is delivered at a terminal in a uni-directional manner and it is not important to provide an equal impedance in the other direction. For example, an integrated circuit that drives a laser diode delivers power to the diode only at logic level 1. Again, only one of the digital impedances in FIG. 2 need be used.

The above disclosure addresses primarily the issue of controlling the value of an impedance presented at a terminal of the circuit. It should be appreciated that this is a very important capability in integrated circuit technology where precise impedances are hard to come by. However, the principles of this invention may be applied to other aspects, such as controlling the manufacturing variability of other components within the integrated circuits (and thereby more tightly controlling the operational characteristics of such circuits). For example, control of the characteristics of a MOS transistor as a transistor.

When an integrated circuit is designed, it is almost always possible to analyze the design (prior to the circuit's manufacture) and identify sections of the circuit, or specific elements of the circuit, i.e., transistors, that are critical to the operation of the circuit in one sense or another. Typically, the parameter of interest to designers is speed of the circuit (or, frequency response of the circuit), delay of signals through the circuit, and power consumption of the circuit. Having identified the critical elements in a circuit, the designer may choose to alter the design by replacing all critical transistors with their digitally altered equivalents (FIG. 3 elements). Thus, when a manufactured integrated circuit happens to come out of the production line with all transistors larger than expected, the digital equivalents adjust themselves during the circuit's operation, according to the principles diclosed herein, to reduce their effective size. A reduction in the transistor's effective size decreases its speed, increases its impedance and reduces its power consumption.

The capability to affect the critical transistors in functional circuitry 100 is suggested in FIG. 1, with blocks 100 (which may be identical to blocks 20 or 30, depending on their placement within circuitry 100). The capability is merely suggested because the exact placement of blocks 101 within circuitry 100 depends on the circuit itself and does not form a part of this invention.

The above disclosure concentrates on controlling the effective size of transistors in order to control a terminal's impedance or to compensate for manufacturing variations in elements within the functional circuitry of the integrated circuit. As disclosed above, this is accomplished with the aid of a bridge having a reference impedance 43 and an "IC sampling" impedance 44. The bridge arrangement develops signals that control the effective size of the transistors. However, control of the effective size of a digitally sized transistor does not have to be limited to a measure of the integrated circuit's variability from a reference. The effective size of the transistor can also be controlled from a measure of the functional effectiveness of the function circuit itself. This is a utilization of the digital size control of a transistor in the classic feedback or feed-forward mode.

Figure 8:
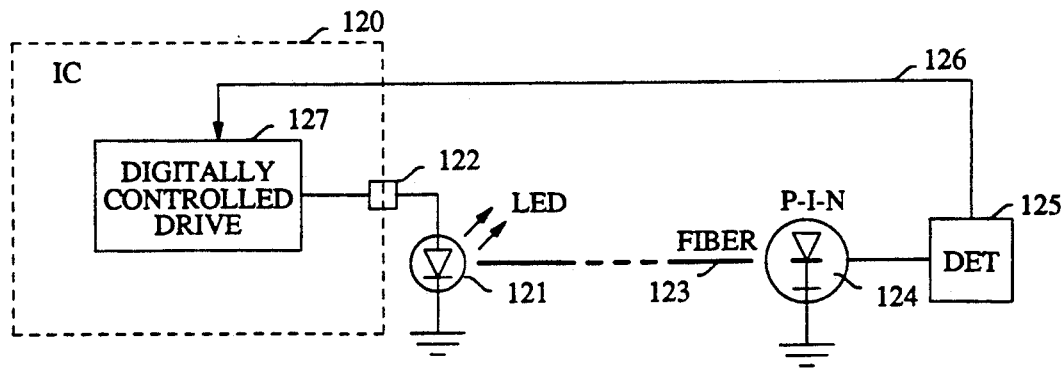
FIG. 8 presents an application where the digitally-sized transistor is controlled via functional signal feedback.

FIG. 8, for example, depicts elements of a system where an integrated circuit 120 is coupled to a laser diode 121 at a terminal 122. The light output of laser diode 121 is coupled to fiber 123, passes through the fiber, and at the "far end" is applied to light detector 124. The electronic output of detector 124 is applied to peak detection means 125 which compares the received signal peak to a given threshold. With a circuit not unlike converter 54 of FIG. 4, a digital signal is developed which is indicative of how closely the received peak signal approaches the desired peak, as specified by the given threshold. That digital signal is communicated via path 126 back to integrated circuit 120, where it is appropriately buffered and applied to the digitally controlled drive circuit 127 that drives laser diode 121 through terminal 122, to affect the amount of power that is injected into laser diode 121.

We claim:
1. A circuit comprising:
a digitally controlled signal drive module comprising a parallel interconnection of transistors connected to an output terminal of said module, said module being responsive to drive control signals;
signal utilization means responsive to output signals received by said signal utilization means from said signal drive module for producing a responsive signal;
means for determining level of output signals received from said signal drive module using said responsive signal and, in response thereto, developing digital drive signals; and means for developing said drive control signals from said digital drive signals.

2. A circuit comprising:
a digitally controlled signal drive module comprising a parallel interconnection of transistors connected to an output terminal of said module;
a light emitting device connected to said output terminal;
an optical fiber forming a channel having a first end and a second end, said optical fiber coupled at said first end to light delivered by said light emitting device;
a light detector coupled to light delivered by said optical fiber at said second end thereof;
a signal translation means responsive to said light detector for developing digital control signals; and
means for applying said digital control signals to said signal drive module to maintain valid logic levels at an output of said light detector.

3. The circuit of claim 2 wherein said means for applying comprises a second path for communicating said digital control signals from said signal translation means to said signal drive module.

4. The circuit of claim 1 further comprising a second path for communicating said drive control signals from said means for developing to said signal drive module.

* * * * *